United States Patent
Chen

(10) Patent No.: US 7,012,455 B2
(45) Date of Patent: Mar. 14, 2006

(54) FREQUENCY DIVIDER AND RELATED METHOD OF DESIGN

(75) Inventor: Po-Chun Chen, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 121 days.

(21) Appl. No.: 10/707,823

(22) Filed: Jan. 15, 2004

(65) Prior Publication Data

US 2005/0088210 A1  Apr. 28, 2005

(30) Foreign Application Priority Data

Oct. 16, 2003  (TW) ............................... 92128754 A

(51) Int. Cl.
*H03B 19/00* (2006.01)
(52) U.S. Cl. ..................... 327/115; 327/117; 377/48
(58) Field of Classification Search ........ 327/113–117; 377/47–48
See application file for complete search history.

(56) References Cited

U.S. PATENT DOCUMENTS 6,121,801 A * 9/2000 Lee ............................. 327/115
6,356,123 B1 * 3/2002 Lee et al. .................... 327/115

* cited by examiner

*Primary Examiner*—Dinh T. Le

(74) *Attorney, Agent, or Firm*—Winston Hsu

(57) ABSTRACT

A frequency divider and related frequency divider designing method for forming a target clock by dividing an original clock by n.5 are disclosed. The method includes the following steps: (a) determining a frequency-dividing ratio of n.5*2, (b) generating a first triggering phase and a second triggering phase relating to the original clock by determining the frequency-dividing ratio, (c) selecting a positive frequency dividing circuit or a negative frequency dividing circuit and an initial value setting manner for the selected positive or negative frequency dividing circuits, and (d) generating the target clock according to the first and second target clocks.

27 Claims, 8 Drawing Sheets

FREQUENCY DIVIDER AND RELATED METHOD OF DESIGN

BACKGROUND OF INVENTION

1. Field of the Invention

The invention relates to a frequency divider and related method of design, and more particularly, to a non-integer frequency divider and related method of design.

2. Description of the Prior Art

Please refer to FIG. 1 showing a circuit diagram of a noninteger frequency divider 10 disclosed in U.S. Pat. No. 6,356,123. The non-integer frequency divider 10 includes a phase shifter 12, four sets of ripple counters 14, 16, 18, 20, and a synthesizing circuit 22. The phase shifter 12 generates a first clock CLK0 and a second clock CLK90 delayed from the first clock CLK0 by 90 degrees. The ripple counters 14, 16, 18, 20 each include three serial D flip-flops, with an output end Q of each D flip-flop connected to an input end D of a next D flip-flop, and the output end Q of the last D flip-flop connected to the input end D of the initial D flip-flop via an inverter. The D flip-flops of the ripple counters 14, 18 and the ripple counters 16, 20 are rising-edge-triggered D flip-flops and falling-edge-triggered D flip-flops, respectively. This means the D flip-flops are triggered by a rising edge or a falling edge of a clock CLK, respectively. All the clock input ends CLK of the D flip-flops in the ripple counters 14, 16 receive the first clock CLK0. All the clock input ends CLK of the D flip-flops in the ripple counters 18, 20 receive the second clock CLK90. The synthesizing circuit 22 includes two XOR gates 24, 26 and an OR gate 28. Two input ends of the XOR gate 24 are connected to output ends A, B of the ripple counters 14, 20, respectively. Two input ends of the XOR gate 26 are connected to output ends C, D of the ripple counters 16, 18, respectively. Two input ends of the OR gate 28 are connected to output ends E, F of the XOR gates 24, 26, respectively. Additionally an output end of the OR gate 28 generates a target clock.

Please refer to FIG. 2 showing a waveform diagram of the first clock CLK0, the second clock CLK90, the signals at the output ends A-F, and the target clock during the noninteger frequency divider 10 operations. The ripple counters 14, 16, 18, 20 generate four divided clocks, each divided clock having a frequency being ⅙ that of the first clock CLK0 (i.e. having a period six times that of the first clock). By properly choosing the clocks (e.g. the output ends A–D of the ripple counters 14, 16, 18, 20) to input into the synthesizing circuit 22 for doubling twice (i.e. four times the frequency), the target clock with a frequency being the first clock CLK0 divided by 1.5 can be generated, so that non-integer (1.5) frequency dividing is completed.

The non-integer frequency divider 10 is required to include 12 D flip-flops and generate four divided clocks in order to synthesize the target clock. A reduction in structure and cost is required.

SUMMARY OF INVENTION

It is therefore a primary objective of the claimed invention to provide a non-integer frequency divider using fewer components, to solve the problems described above.

Briefly summarized, a frequency divider dividing an original clock to form a target clock with a frequency factor M being a positive odd number includes a front set circuit, a middle set circuit and a rear set circuit. The front set circuit includes a first clock generator with a clock input end connected to a trigger clock having a frequency the same as that of the original clock and a trigger phase, and a first logic gate with a first input end connected to an output end of the first clock generator, and a second input end connected to a signal input end of the first clock generator. The middle set circuit includes a second clock generator with a clock input end connected to the trigger clock, and (M-3)/2 serially connected first sets of clock generators with a clock input end of each first set of clock generators connected to the trigger clock, a signal input end of the immediately previous clock generator within the (M-3)/2 first sets of clock generators connected to an output end of the first logic gate in the front set circuit, and an output end of the last clock generator within the (M-3)/2 first sets of clock generators connected to a signal input end of the second clock generator in the middle set circuit. And the rear set circuit includes a third clock generator with a clock input end connected to the trigger clock, and a signal input end connected to an output end of the second clock generator in the middle set circuit, and a second logic gate with a first input end connected to an output end of the third clock generator in the rear set circuit, a second input end connected to the output end of the second clock generator in the middle set circuit, and an output end for outputting the target clock.

The present invention further provides a non-integer frequency divider for dividing an original clock to form a target clock such that the frequency of the original clock is n.5 times the frequency of the target clock. The noninteger frequency divider includes a phase shifter for generating a first clock and a second clock according to the original clock, a first dividing circuit receiving the first clock and generating a first target clock in cooperation with a first front set circuit, a first middle set circuit and a first rear set circuit connected serially in sequence inside, wherein the first front set circuit comprises a first clock generator and a first logic gate, the first middle set circuit comprises a second clock generator, $k_1$ serially connected first sets of clock generators in which $k_1 \geq 0$, and $n-k_1-1$ serially connected second sets of clock generators in which $n-k_1-1 \geq 0$ and in which $k_1$ is determined according to n and a trigger phase of the first clock, and the first rear set circuit comprises a third clock generator and a second logic gate, a second dividing circuit receiving the second clock and generating a second target clock in cooperation with a second front set circuit, a second middle set circuit and a second rear set circuit connected serially in sequence inside, wherein the second front set circuit comprises a fourth clock generator and a third logic gate, the second middle set circuit comprises a fifth clock generator, $k_2$ serially connected third sets of clock generators in which $k_2 \geq 0$, and $n-k_2-1$ serial connected fourth sets of clock generators in which $n-k_2-1 \geq 0$ and in which $k_2$ is determined according to n and a trigger phase of the second clock, and the second rear set circuit comprises a sixth clock generator and a fourth logic gate, and a synthesizing circuit outputting the target clock according to the first target clock and the second target clock.

The present invention further provides a method for designing a frequency divider to divide an original clock to form a target clock with a dividing factor being a positive odd number. The method includes selecting a trigger phase corresponding to the original clock according to the dividing factor, and if a positive dividing circuit is selected, determining the initial status of a plurality of clock generators of the positive dividing circuit, in order to generate the target clock by the trigger phase and a waveform with the same frequency as the original clock, and according to the dividing factor, if a negative dividing circuit is selected, modifying the trigger phase into a modified trigger phase, and determining the initial status of a plurality of clock generators of the negative dividing circuit, in order to generate the target clock by the modified trigger phase and a waveform with the same frequency as the original clock, and according to the dividing factor and the modified trigger phase.

The present invention further provides a method for designing a non-integer frequency divider to divide an original clock to form a target clock such that the original clock is n.5 times to the target clock. The method includes determining a dividing factor to be n.5*2, generating a first trigger phase and a second trigger phase corresponding to the original clock according to the dividing factor, selecting a positive dividing circuit or a negative dividing circuit by the first trigger phase and the dividing factor, and determining the initial status of a plurality of clock generators of the positive dividing circuit or the negative dividing circuit, in order to generate a first target clock, selecting a positive dividing circuit or a negative dividing circuit by the second trigger phase and the dividing factor, and determining the initial status of a plurality of clock generators of the positive dividing circuit or the negative dividing circuit, in order to generate a second target clock, and generating the target clock according to the first target clock and the second target clock.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
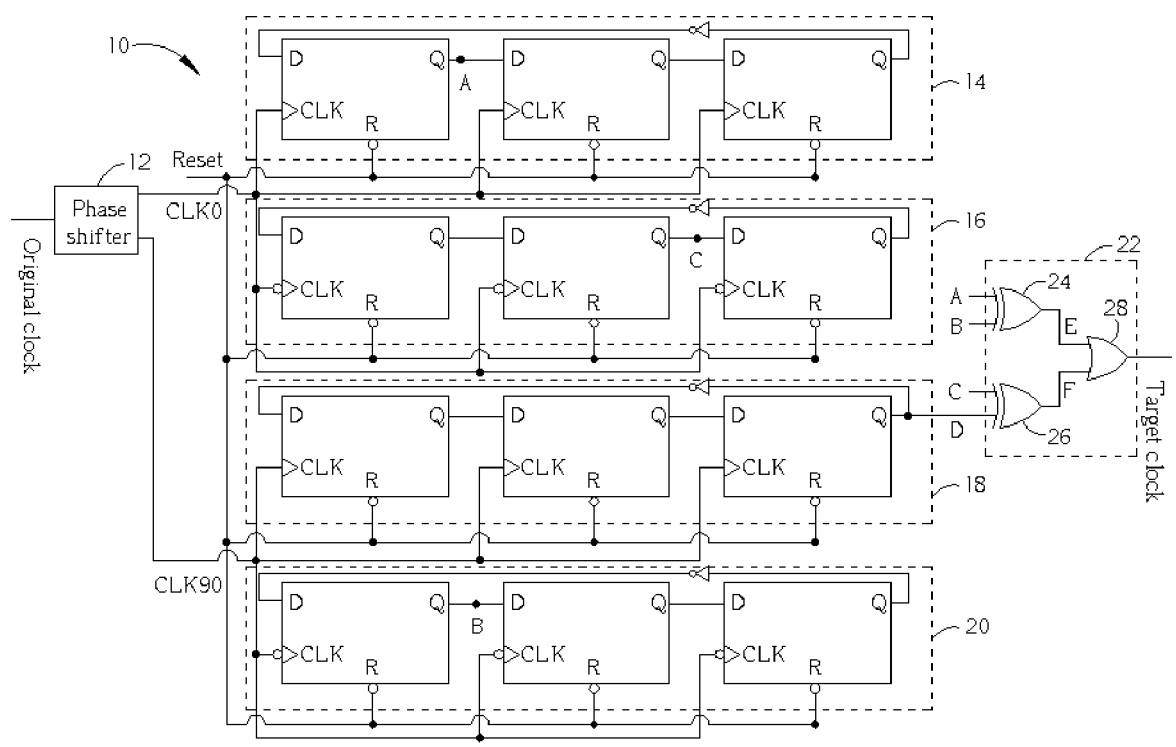
FIG. 1 is a circuit diagram of a conventional non-integer frequency divider.
Figure 2:
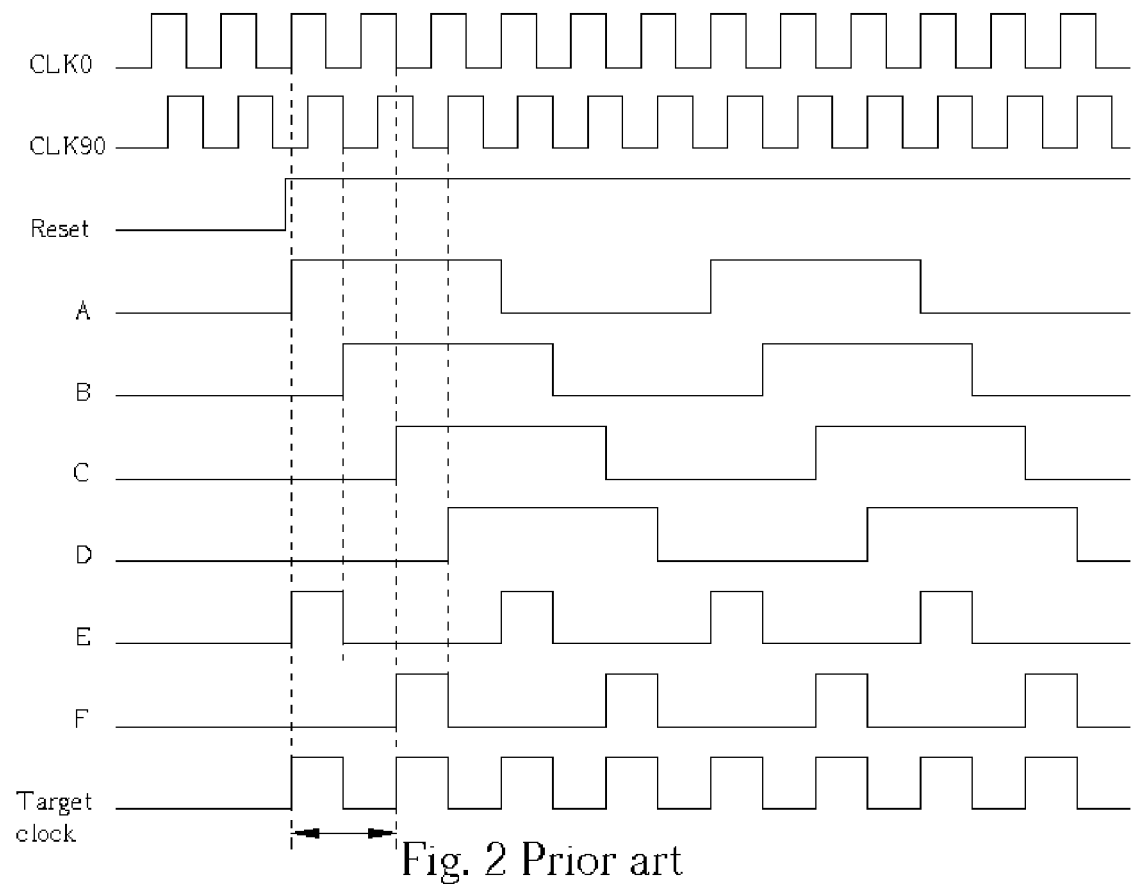
FIG. 2 a waveform diagram while the conventional non-integer frequency divider operates.

According to the prior art described above, the non-integer frequency divider generates four divided clocks with the same frequency being ⅙ that of the first clock CLK0 but at different phases. The synthesizing circuit (22 in FIG. 1) then twice doubles these clocks (i.e. four times the frequency), in order to generate the target clock with a frequency being 1.5 times that of the first clock CLK0. In order to improve this, the present invention generates only two divided clocks with the same frequency being ⅓ that of the first clock CLK0 but at different phases, and then the synthesizing circuit doubles these clocks only once (i.e. two times the frequency). In this way, the present invention generates a target clock with a frequency being 1.5 times that of the first clock CLK0. In such a manner, the number of components can be reduced because the number of divided clocks and the number of times doubling are reduced.

Figure 3:
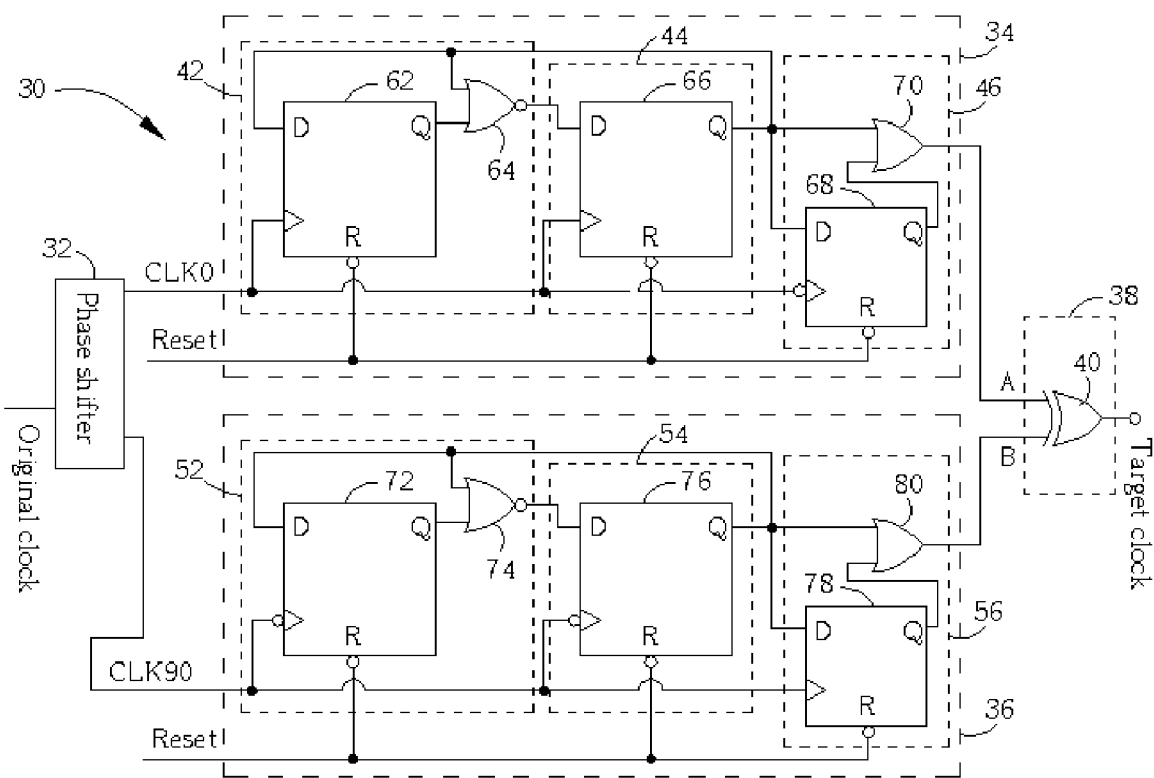
FIG. 3 is a circuit diagram of a non-integer frequency divider according to a first embodiment of the present invention.

Please refer to FIG. 3 showing a circuit diagram of a non-integer frequency divider 30 according to the present invention. The non-integer frequency divider 30 includes a phase shifter 32, two dividing circuits 34, 36, and a synthesizing circuit 38. The phase shifter 32 generates CLK0 and CLK90 delayed from CLK0 by 90 degrees as in FIG. 1. The two dividing circuits 34, 36 receive CLK0 and CLK90, respectively, to generate two divided clocks at ends A, B, and then the synthesizing circuit 38 (an XOR gate 40 in this embodiment) doubles these clocks a single time. In such a manner, non-integer frequency dividing can be completed as in the prior art shown in FIG. 1.

As described above, the dividing circuit 34 includes a front set circuit 42, a middle set circuit 44 and a rear set circuit 46. The front set circuit 42 includes a rising-edge-triggered clock generator 62, and a NOR gate 64 with its first input end and second input end respectively connected to an output end Q and a signal input end D of the rising-edge-triggered clock generator 62. The middle set circuit 44 includes a rising-edge-triggered clock generator 66, with its input end D connected to the output end of the NOR gate 64 in the front set circuit 42, and its output end Q connected to the signal input end D of the rising-edge-triggered clock generator 62 in the front set circuit 42. The rear set circuit 46 includes a falling-edge-triggered clock generator 68 with its signal input end D connected to the output end Q of the rising-edge-triggered clock generator 66 in the middle set circuit 44, and a OR gate 70 with its first input end and second input end respectively connected to an output end Q of the falling-edge-triggered clock generator 68 and the output end Q of the rising-edge-triggered clock generator 66 in the middle set circuit 44. An output end of the OR gate 70 is for outputting a corresponding divided clock. All the clock input ends CLK of the rising-edge-triggered clock generators 62, 66 and the falling-edge-triggered clock generator 68 receive CLK0, and are controlled by a Reset signal. However, the rising-edge-triggered clock generators 62, 66 transmit signals at its signal input end D to its output end Q at a rising edge of CLK0 and a high level of the Reset signal. And the falling-edge-triggered clock generator 68 transmits signals at its signal input end D to its output end Q at a falling edge of CLK0 and a high level of the Reset signal.

The included components and connections of the dividing circuit 36 is similar to those of the dividing circuit 34. However, the clock input ends CLK of the rising-edge-triggered clock generators 62, 66 and the falling-edge-triggered clock generator 68 in the dividing circuit 34 receive CLK0, while clock input ends CLK of falling-edge-triggered clock generators 72, 76 and the rising-edge-triggered clock generator 78 in the dividing circuit 36 receive CLK90. Moreover, the front set circuit 42 and the middle set circuit 44 of the dividing circuit 34 use the rising-edge-triggered clock generators 62, 66, while a front set circuit 52 and a middle set circuit 54 of the dividing circuit 36 use the falling-edge-triggered clock generators 72, 76. In addition, the rear set circuit 46 of the dividing circuit 34 uses the falling-edge-triggered clock generator 68, while a rear set circuit 56 of the dividing circuit 36 uses the rising-edge-triggered clock generator 78.

Figure 4:
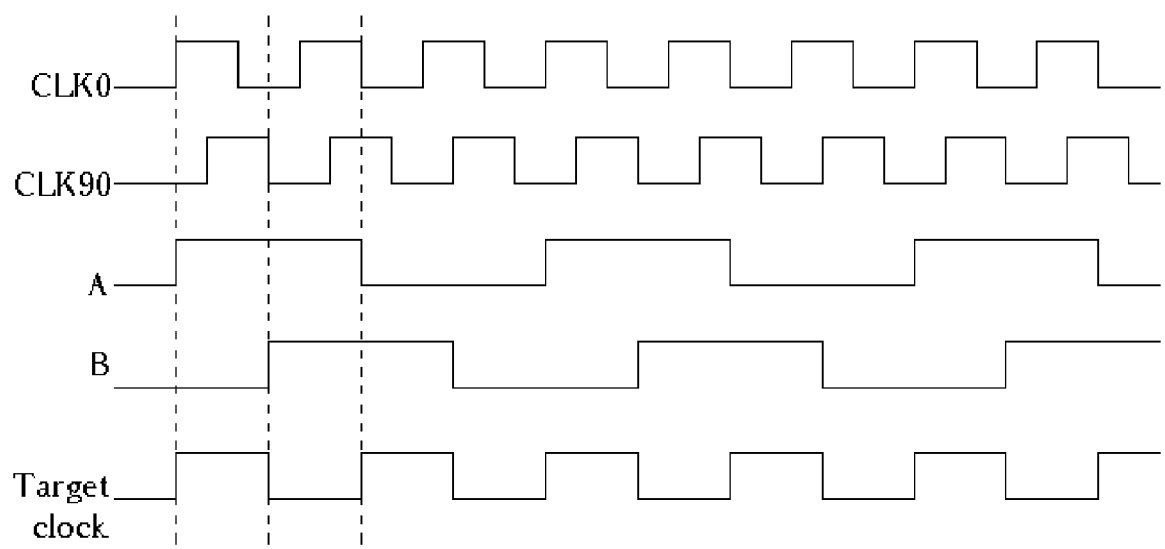
FIG. 4 is a waveform diagram while the non-integer frequency divider operates according to the first embodiment of the present invention.

Please refer to FIG. 4 showing a waveform diagram of CLK0, CLK90, the divided clocks at the output ends A, B of the dividing circuit 34, 36, and a target clock while the non-integer frequency divider 30 operates. For frequency dividing by 1.5, the dividing circuits 34, 36 output the divided clocks with a frequency being ⅓ that of CLK0 (i.e. with a period three times that of CLK0) from the output ends A, B using the three edge-triggered clock generators. In addition, triggered by CLK0 and CLK90 being 90 degrees delayed in phase, and by means of different combinations of the three edge-triggered clock generators within the dividing circuits 34, 36; two divided clocks differing by 90 degrees in phase and having a period three times that of CLK0 are output from the ends A, B. Subsequently, the synthesizing circuit 38 utilizes an XOR gate 40 to synthesize the two divided clocks differing by 90 degrees in phase to form the target clock, that is, to reduce the period by one half (or to double the frequency), in order to generate the frequency divided by 1.5 target clock.

Of course, CLK0 and CLK90 can be the original clock input into the phase shifter 32 and a clock delayed from it by 90 degrees, or can be chosen from two clocks having a phase difference of 90 degrees, such as CLK135 (delayed from the original clock by 135 degrees) and CLK225. In this case, the resulting target clock differs only in phase from the target clock resulting from CLK0 and CLK90. The dividing circuit 34 of the non-integer frequency divider 30 receives CLK0, and the clock generators included in its front set circuit 42 and middle set circuit 44 are rising-edge-triggered clock generators and the clock generator included in its rear set circuit 46 is a falling-edge-triggered clock generator, so that the dividing circuit 34 is a positive dividing circuit. Conversely, the clock generators included in the front set circuit 52 and middle set circuit 54 of the dividing circuit 36 are falling-edge-triggered clock generators and the clock generator included in its rear set circuit 56 is a rising-edge-triggered clock generator, so that the dividing circuit 36 is a negative dividing circuit. Of course, if the dividing circuit 36 is a positive dividing circuit, it has the same structure as that of the dividing circuit 34. In other words, the clock generators 72, 76 included in the front set circuit 52 and the middle set circuit 54 are replaced by rising-edge-triggered clock generators, the clock generator 78 included in the rear set circuit 56 are replaced by falling-edge-triggered clock generators. In this case the phase shifter 32 is required to generate another clock CLK 270 delayed from CLK0 by 270 degrees (or leading CLK0 by 90 degrees, or inverted from CLK90, i.e. having a difference of 180 degrees from CLK 90), to output to the dividing circuit 36. Since there is a difference of 180 degrees from CLK 90, and the sampling between the trigger points of the positive dividing circuit and the negative dividing circuit has also a difference of 180 degrees, an equivalent result can be obtained.

Figure 5:
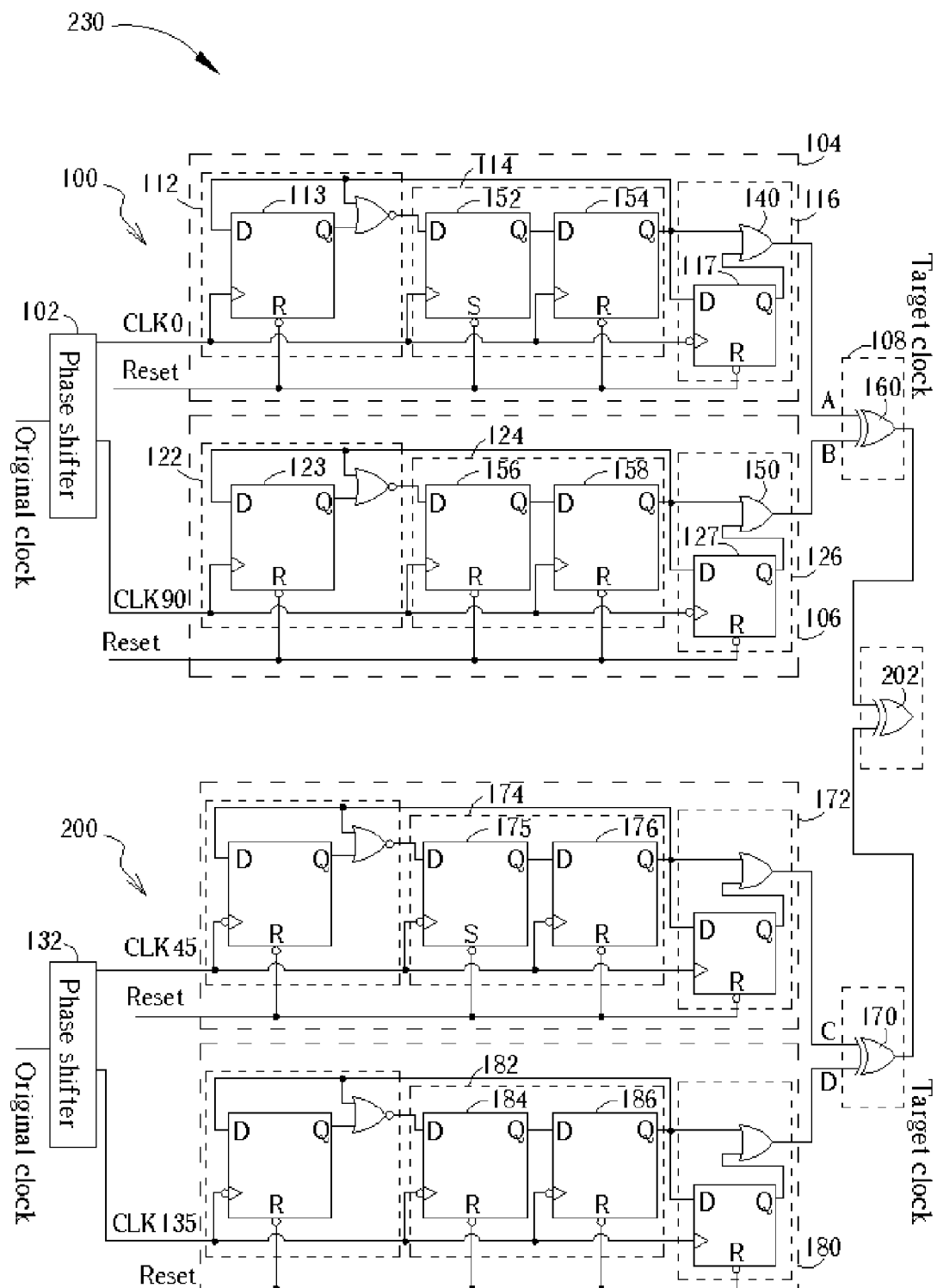
FIG. 5 is a circuit diagram of a non-integer frequency divider according to a second embodiment of the present invention.
Figure 6:
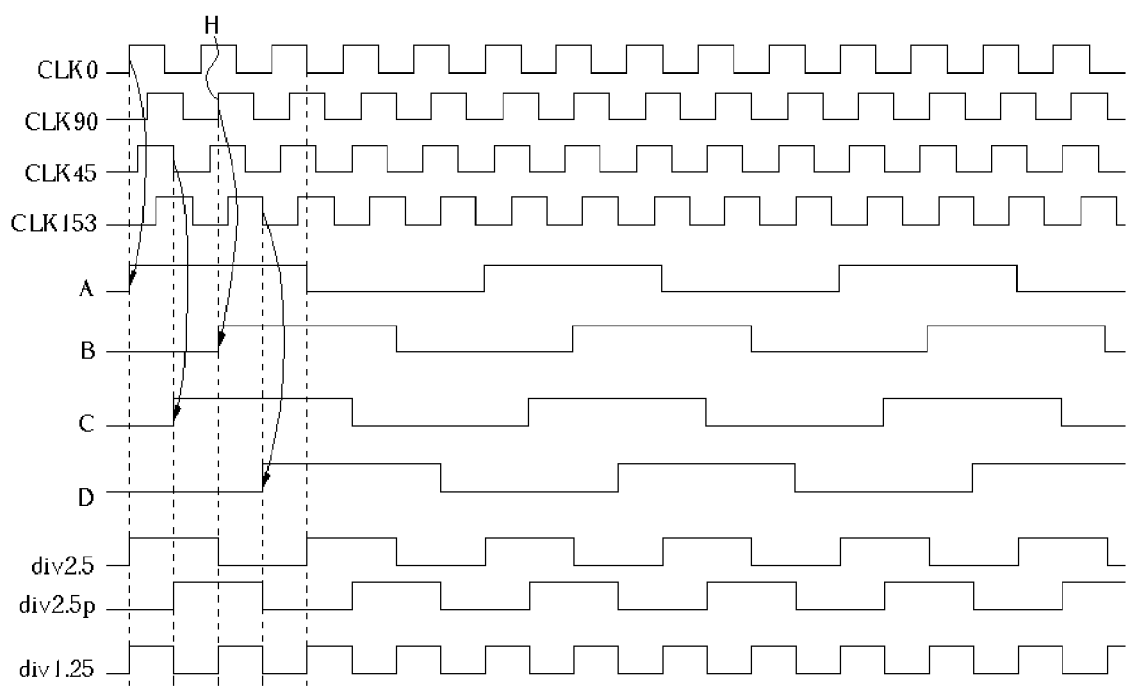
FIG. 6 is a waveform diagram while the non-integer frequency divider operates according to the second embodiment of the present invention.

Subsequently, for frequency dividing by 1.25, combine two non-integer (2.5) frequency dividers 100, 200 as shown in FIG. 5. The upper non-integer frequency divider 100 has a structure similar to that of the non-integer frequency dividers 30 shown in FIG. 3, and includes a phase shifter 102 for generating CLK0 and CLK90, two dividing circuits 104, 106 for generating two corresponding divided clocks, and a synthesizing circuit 108. The synthesizing circuit 108 and the phase shifter 102 have the same structure and function as that shown in FIG. 3, thus a further description is hereby omitted. The difference is that the dividing circuits 104, 106 are both positive dividing circuits, hence edge-triggered clock generators 113, 123 in the front set circuits 112, 122 are rising-edge-triggered clock generators, and edge-triggered clock generators 117, 127 in the rear set circuits 116, 126 are falling-edge-triggered clock generators. However, middle set circuits 114, 124 are different. The middle set circuit 114 is a serial connection of an initially-set-high rising-edge-triggered clock generator 152 and an initially-set-low rising-edge-triggered clock generator 154. The middle set circuit 124 is a serial connection of two initial-set-low rising-edge-triggered clock generators 156, 158. The initially-set-high rising-edge-triggered clock generator 152 transmits signals at its signal input end D to its output end Q, and the lower initially-set-low rising-edge-triggered clock generator 156 is delayed for a period being activated since it is initially set low. As shown by the output waveforms of the output ends A, B and CLK0, CLK90 in FIG. 6, for the positive dividing circuits 104, 106, the output waveforms of the output ends A, B change from 0 to 1 at a rising edge of both CLK0 and CLK90. This is different from FIG. 4, in which the output waveforms of the output ends A, B change from 0 to 1 at a rising edge of CLK0 and at a falling edge of CLK90 (because both a positive dividing circuit and a negative dividing circuit are used in FIG. 3). Moreover in FIG. 5, since the edge-triggered clock generators 156 in the middle set circuit 124 are initially set low and are delayed for a period being activated, the waveform of B changes from 0 to 1 at time point H delayed by a period, instead of the first rising edge of CLK90.

As for the lower non-integer (2.5) frequency dividers 200 shown in FIG. 5, the reference clocks are not limited to CLK0 and CLK90. Two negative dividing circuits or a combination of one positive and one negative dividing circuit can also be applied. Since the frequency is required to divided by 1.25, CLK45 and CLK135 are used with two negative dividing circuits, to have the change points (0 to 1 or 1 to 0) of the output waveform of the output ends C, D located in the middle of the change points of the output waveform of the output ends A, B. Therefore, the output waveform of the output ends A, B is operated on by the XOR gate 160 to generate 2.5-time frequency, the output waveform of the output ends C, D is operated on by the XOR gate 170 to generate 2.5-time frequency, so that frequency dividing by 1.25 can be completed after operated on by another XOR gate 202.

According to the above description, when generating a target clock having a frequency being n.5 times that of the original clock (wherein n is an integer), it is required to perform frequency dividing by 2n+1 on the original clock, and choose two clocks different in phase, and then use a proper design of serially connected rising/falling-edge triggered clock generators in positive/negative dividing circuits to generate two divided clocks. The divided clocks are passed to the synthesizing circuit to half the period (or double the frequency), in order to generate the target clock having a frequency being that of the original clock divided by n.5.

Figure 7:
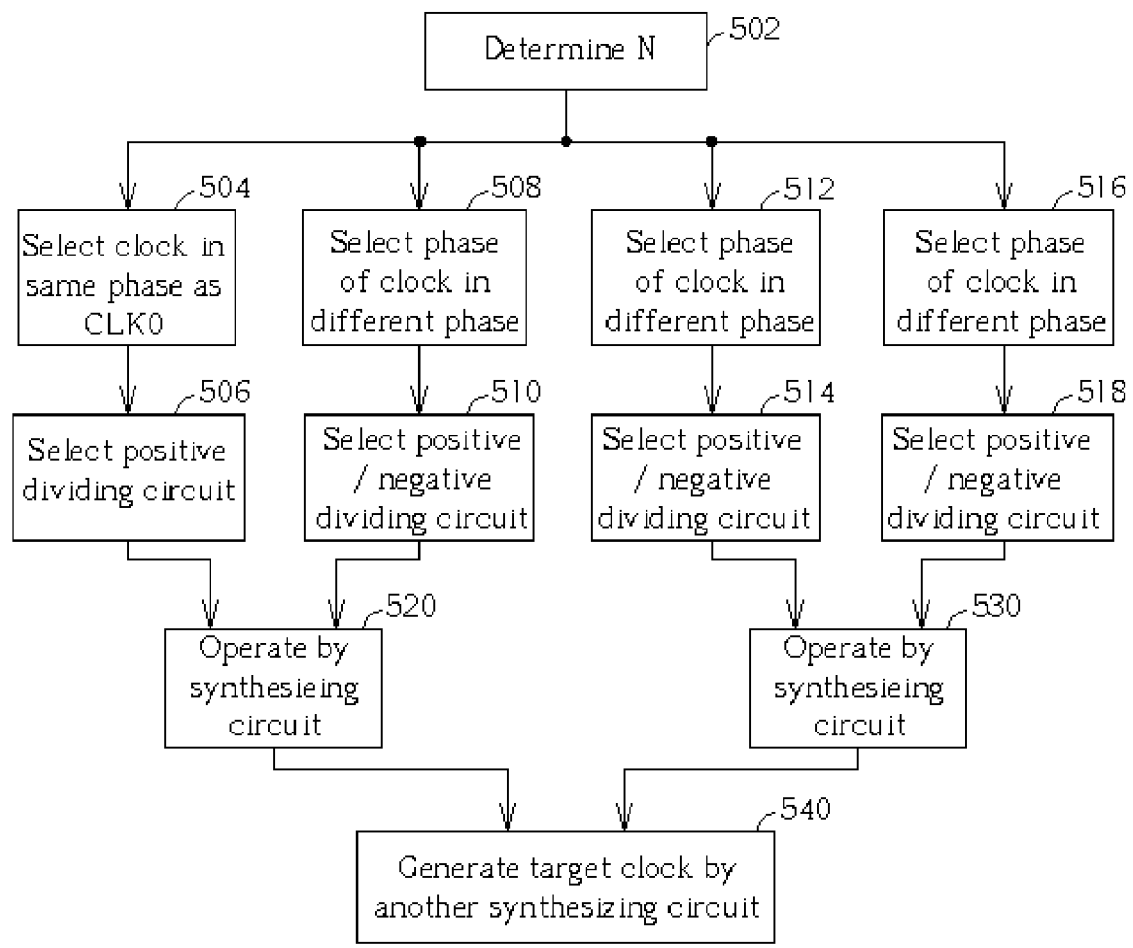
FIG. 7 is a flowchart for designing a non-integer frequency divider according to the present invention.

Please refer to FIG. 7 showing a flowchart for designing a non-integer frequency divider according to the present invention. In Step 502, determine a factor of frequency dividing N=2*(n.5)=2n+1 according to the required target clock having n.5 times that of the original clock. Using 2.5 times as in FIG. 5 as an example, N=2*2.5=5. Subsequently, design the non-integer frequency divider composed of a positive dividing circuit and another corresponding dividing circuit based on CLK0 in Steps 504, 508, or design another non-integer frequency divider in Steps 512, 516. In Step 504, since the design is based on CLK0, select a positive dividing circuit triggered by the rising (positive) edge of CLK0, and then according to Step 508 and Step 510 there are two possibilities of the other dividing circuit: positive or negative. Of course we can select a negative dividing circuit triggered by the falling (negative) edge of CLK0, however, it is unusual because there will be half a period of wasted time. And according to Steps 512, 516, other non-integer frequency dividers are not limited to be based on CLK0. Instead, any of its dividing circuits can be positive or negative. Therefore, there are four design possibilities.

Firstly, design of a dividing circuit of the first type is described as follows. In Step 504, input the rising edge of CLK0 being the same as the original clock, as a trigger edge into the divider. In Step 506, a positive dividing circuit is used to realize the first type dividing circuit and to form a first dividing circuit. Take FIG. 5 as an example, the dividing circuit 104 receives the first clock CLK0 and is a positive dividing circuit, which means the edge-triggered clock generator 113 in the front set circuit 112 and the edge-triggered clock generators 152, 154 in the middle set circuit 114 are rising-edge-triggered clock generators, while the edge-triggered clock generator 117 in the rear set circuit 116 is a falling-edge-triggered clock generator. The edge-triggered clock generators 152, 154 in the middle set circuit 114 are an initial-set-high rising-edge-triggered clock generator and an initial-set-low rising-edge-triggered clock generator, respectively. Since an initially-set-low rising-edge-triggered clock generator is delayed for a period before being activated, when based on CLK0, only the last edge-triggered clock generator is designed as an initially-set-low rising-edge-triggered clock generator. The previous n−1 edge-triggered clock generators are designed as initially-set-high rising-edge-triggered clock generators. Since n=2 in FIG. 5, there is only one (2−1=1) initially-set-high rising-edge-triggered clock generator 152.

Subsequently, design a dividing circuit of the second type is described as follows. In Step 508, calculate a trigger phase of a clock being of different phase, that is, to calculate how much a phase difference between CLK0 and the second clock is required for doubling the frequency after being operated on by the synthesizing circuit. In Step 510, select a positive/negative dividing circuit. The selection relates to the trigger phase of the clock being of different phase (for 180 degrees), and is described as follows. The trigger phase of the clock being of different phase can be calculated according to $$\frac{360 \times N \div 2 \div 2}{360}$$

=k.m (cycle), wherein k is an integer and m is decimal. If a positive dividing circuit is selected, the trigger phase is equal to R=360*0.m, where s=k (cf. s is the number of the initial-set-low edge-triggered clock generators in the n−1 edge-triggered clock generators except for the last edge-triggered clock generator in the middle set circuit). If a negative dividing circuit is selected and the falling-edge-triggered clock generators are used, the trigger phase is equal to F=180+R. If F>360 then F=F−360 and s=k, and if F<360 then F=F and s=k−1. As for the dividing circuit 106 shown in FIG. 5, the trigger phase is calculated by $$\frac{360 \times 5 \div 2 \div 2}{360}$$

=1.25, thus k=1 and m=25. If the dividing circuit 106 is selected to be a positive circuit, the trigger phase is equal to R=360*0.25=90 and s=k=1. In this way, select the clock being of different phase CLK90 to be a clock for driving the dividing circuit 106. The middle set circuit 124 uses the initially-set-low edge-triggered clock generator 156 to cooperate with the last edge-triggered clock generator 158 in the middle set circuit 124. Conversely, if the dividing circuit 106 is selected to be a negative circuit (not shown in FIG. 5), F=180+R(90)=270, and since F=270<360 and s=k−1=1−1=0, only the last one in the middle set circuit is an initially-set-low falling-edge-triggered clock generator. Which is the same as the next dividing circuit 172. However, the clock being of different phase CLK270(F) is selected for driving the dividing circuit 106. Step 504 and Step 508 result in the same Step 520, to form a first type and a second type of dividing circuit, respectively. The synthesizing circuit (e.g. the XOR gate 160 shown in FIG. 5) then performs frequency dividing by n.5.

In Step 512 the trigger phase of any clock of different phase except for CLK0 is determined. In Step 514 select a positive dividing circuit or a negative dividing circuit to form a third dividing circuit. In Step 516 calculate how much phase difference is required for doubling the frequency after being operated on by the synthesizing circuit according to the trigger phase obtained in Step 512. In Step 518 select a positive dividing circuit or a negative dividing circuit to form a fourth dividing circuit, thus there are 4 different kinds of combination. As for the dividing circuit 172, shown in FIG. 5, in which the clock being of different phase CLK45 for driving it is selected according to $$\frac{90 \times n.5}{360}$$

=k.m; where 360*0.m=R (rising edge trigger), s=k and 180+R=F (falling edge trigger). If F>360 then F=F−360 and s=k, otherwise F=F and s=k−1 (s and k are defined the same as above), thus n=2 (i.e. 2.5-time frequency dividing), the trigger phase of the driving clock is $$\frac{90 \times 2.5}{360} = 0.625$$

=0.625, hence k=0, m=625, R=360*0.625=225, and F=180+225(R)=405. F is over 360 so it is modified into 405−360=45, so that s=k=0. In this case, the dividing circuit 172 is a negative dividing circuit, therefore select the clock being of different phase CLK45 (i.e. F having the same phase as the clock being of different phase CLK405) for driving the dividing circuit 172. And since F(405)>360 and s=k=0, the edge-triggered clock generators 175, 176 in the middle set circuit 174 of the dividing circuit 172 are an initially-set-high falling-edge-triggered clock generator and an initially-set-low falling-edge-triggered clock generator, respectively. Of course, the dividing circuit 172 can also be a positive dividing circuit. Accordingly, a rising edge is required to drive the dividing circuit 172. Therefore, select the clock being of different phase CLK225(R) for driving the dividing circuit 172. And since s=k=0, the situation is similiar to the dividing circuit 104 shown in FIG. 5, but CLK255 is selected instead of CLK0.

In Step 516 and Step 518 design the fourth dividing circuit. In Step 516, select the trigger phase of the clock being of different phase corresponding to Step 512. As for the lowest dividing circuit 180 shown in FIG. 5, the clock being of different phase CLK135 is selected according to $$\frac{90 \times n.5 + 360 \times N \div 2 \div 2}{360} = \frac{90 \times 2.5 + 360 \times 5 \div 2 \div 2}{360}$$

=k.m=1.875, thus k=1, m=875, R=360*0.875=315, and F=315+180=495. F is over 360 so is modified into 495−360=135, so that s=k=1. In this case, the dividing circuit 180 is a negative dividing circuit, therefore select the clock being of different phase CLK135 (i.e. F having the same phase as the clock being of different phase CLK495) for driving the dividing circuit 180. And since s=k=1, the middle set circuit 182 uses the initially-set-low falling-edge-triggered clock generator 184 in cooperation with the last edge-triggered clock generator 186 in the middle set circuit 182 (which is also an initially-set-low falling-edge-triggered clock generator). Of course, the dividing circuit 180 can also be a positive dividing circuit, and accordingly, a rising edge is required to drive the dividing circuit 180. Therefore, select the clock being of different phase CLK315(R) for driving the dividing circuit 180. And since s=k=1, it is the same as the dividing circuit 104 shown in FIG. 5, but CLK315 is selected instead of CLK0.

The outputs of the first and the second dividing circuits are synthesized into the target clock (e.g. frequency divided by 2.5 or another non-integer value) in Step 520. The outputs of the third and the fourth dividing circuits are synthesized into the target clock in Step 530. And, in Step 540, another synthesizing circuit (e.g. an XOR gate) divides the target clocks generated in Step 520 and Step 530, such as synthesizing div2.5 and div2.5p into a 1.25(2.5/2) target clock. Since in Step 510, Step 514 and Step 518, a positive or a negative circuit can be selectively selected, there are 2*2*2=8 different combinations of non-integer frequency dividers according to the present invention.

Figure 8:
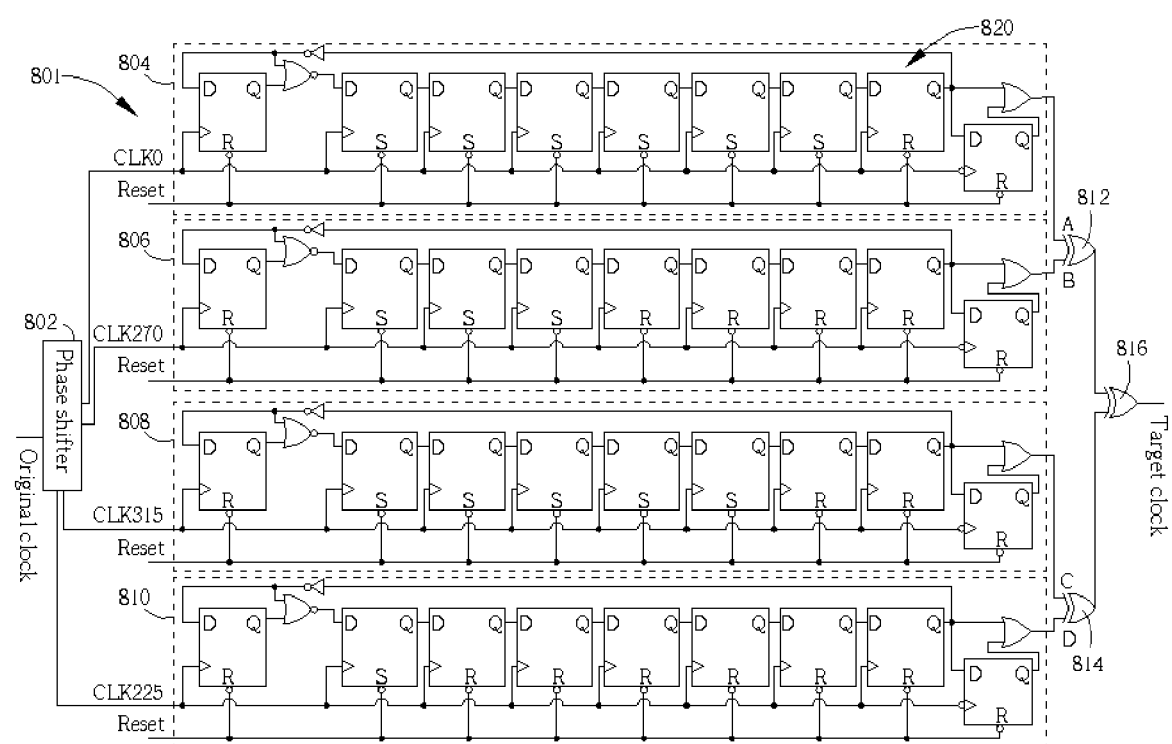
FIG. 8 is a flowchart for designing a non-integer frequency divider according to a third embodiment of the present invention.

For a clearer description of FIG. 7, please refer to FIG. 8 showing a circuit diagram according to another non-integer frequency divider 801 according to the present invention. The non-integer frequency divider 801 divides an original clock into a target clock, wherein the frequency of the original clock is 3.75 times that of the target clock. The non-integer frequency divider 801 includes a phase shifter 802 for generating four driving clocks being of different phases according to the original clock, and four dividing circuits 804, 806, 808, 810 (shown from top to bottom in FIG. 8) designed according to the flowchart shown in FIG. 7. For simplicity of description, the four dividing circuits are positive dividing circuits.

In order to generate the divided by 3.75 target clock, it is required to design two sets of divided by 7.5 target clocks. Therefore in Step 502, Step 504 and Step 506, N=2*(7.5)=15 and the driving circuit is driven by a clock in the same phase CLK0. A dividing circuit 804 has the last edge-triggered clock generator 820 designed as an initially-set-low rising-edge-triggered clock generator, and the previous 6 (n−1=7−1=6) are designed as initially-set-high rising-edge-triggered clock generators, to form the first dividing circuit 804. And then in Step 502, Step 508 and Step 510, a dividing circuit 806 is driven by a clock being of different phase CLK 270 (which is selected according to $$\frac{360 \times 15 \div 2 \div 2}{360} = 3.75$$

=3.75, s=k=3 since the dividing circuit 806 is a positive driving circuit, and m=75; 360*0.75=270(R)). Since s=k=3, there are 3 initially-set-high rising-edge-triggered clock generators replaced by initially-set-low rising-edge-triggered clock generators in a middle set circuit of the dividing circuit 806, and the last initial-set-low rising-edge-triggered clock generator. There are 3 initially-set-high rising-edge-triggered clock generators prior to 4 initially-set-low rising-edge-triggered clock generators.

Subsequently in Step 502, Step 512 and Step 514, a dividing circuit 808 is driven by a clock being of different phase CLK 315 (which is selected according to $$\frac{90 \times 7.5}{360} = 1.875$$

=1.875, s=k=1 since the dividing circuit 808 is a positive driving circuit, and m=875; 360*0.875=315(R)). Since s=k=1, there is one initially-set-high rising-edge-triggered clock generator replaced by an initially-set-low rising-edge-triggered clock generator in a middle set circuit of the dividing circuit 808, and the last initial-set-low rising-edge-triggered clock generator. There are 5 initially-set-high rising-edge-triggered clock generators prior to 2 initially-set-low rising-edge-triggered clock generators. Similarly in Step 502, Step 516 and Step 518, a dividing circuit 810 is driven by a clock being of different phase CLK 225 (which is selected according to $$\frac{90 \times 7.5 + 360 \times 15 \div 2 \div 2}{360}$$

=5.625, s=k=5 since the dividing circuit 810 is a positive driving circuit, and m=625; 360*0.625=225(R)). Since s=k=5, there are 5 initially-set-high rising-edge-triggered clock generators replaced by 5 initially-set-low rising-edge-triggered clock generators in a middle set circuit of the dividing circuit 810, and the last initial-set-low rising-edge-triggered clock generator. There is 1 initially-set-high rising-edge-triggered clock generator prior to 6 initially-set-low rising-edge-triggered clock generators.

The four dividing circuits described above generate divided by 15 target clocks, via three XOR gates 812, 814, 816. These clocks are used for synthesizing divided clocks A, B at input ends of the dividing circuit 804, 806 to form a divided by 7.5 target clock. The frequency of the original clock is 7.5 times the divided by 7.5 target clock, in order to synthesize divided clocks C, D at input ends of the dividing circuit 808, 810 into a divided by 7.5 target clock. The frequency of the original clock is 7.5 times the divided by 7.5 target clock, in order to synthesize the divided by 7.5 target clock, which is synthesized by the XOR gates 812, 814 into the target clock, wherein the frequency of the original clock is 3.75 times the target clock.

In contrast to the prior art, the non-integer frequency divider requires fewer flip-flops to perform the same function as the prior art, thus it has advantages of compactness and low cost. Moreover, the present invention provides 8 different combinations of non-integer frequency dividers, so that it is flexible during the manufacturing process.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A frequency divider dividing an original clock into a target clock, the frequency of the target clock being equal to the frequency of the original clock divided by M, M being a positive odd integer equal to or greater than 3, the frequency divider comprising:
 a front set circuit comprising:
  a first clock generator with a clock input end connected to a trigger clock having a frequency the same as that of the original clock and a trigger phase; and
  a first logic gate with a first input end connected to an output end of the first clock generator, and a second input end connected to a signal input end of the first clock generator;
 a middle set circuit comprising:
  a second clock generator with a clock input end connected to the trigger clock; and
  (M−3)/2 serially connected first sets of clock generators with a clock input end of each first set of clock generators connected to the trigger clock, a signal input end of the first clock generator within the (M−3)/2 first sets of clock generators connected to an output end of the first logic gate in the front set circuit, and an output end of the last clock generator within the (M−3)/2 first sets of clock generators connected to a signal input end of the second clock generator in the middle set circuit; and
 a rear set circuit comprising:
  a third clock generator with a clock input end connected to the trigger clock, and a signal input end connected to an output end of the second clock generator in the middle set circuit; and
  a second logic gate with a first input end connected to an output end of the third clock generator in the rear set circuit, a second input end connected to the output end of the second clock generator in the middle set circuit, and an output end for outputting the target clock.

2. The frequency divider of claim 1, wherein the first clock generator in the front set circuit, the second clock generator in the middle set circuit, and the (M−3)/2 first sets of clock generators are rising-edge-triggered clock generators, and the third clock generator in the rear set of circuit is a falling-edge-triggered clock generator.

3. The frequency divider of claim 1, wherein the first clock generator in the front set circuit, the second clock generator in the middle set circuit, and the (M−3)/2 first sets of clock generators are falling-edge-triggered clock generators, and the third clock generator in the rear set of circuit is a rising-edge-triggered clock generator.

4. The frequency divider of claim 1, wherein the trigger phase is 0 degrees, and the trigger clock is identical to the original clock.

5. The frequency divider of claim 4, wherein the first clock generator in the front set circuit, the second clock generator in the middle set circuit, and the third clock generator in the rear set of circuit are initially-set-low clock generators, and the (M−3)/2 first sets of clock generators are initially-set-high clock generators.

6. The frequency divider of claim 1, wherein the first logic gate is a NOR gate, and the second logic gate is an OR gate.

7. A non-integer frequency divider for dividing an original clock to form a target clock, the frequency of the target clock being equal to the frequency of the original clock divided by (2n+1)/2, n being a positive integer equal to or greater than 1, the non-integer frequency divider comprising:
 a phase shifter for generating a first clock and a second clock according to the original clock;
 a first dividing circuit receiving the first clock and generating a first target clock in cooperation with a first front set circuit, a first middle set circuit and a first rear set circuit connected serially in sequence inside, wherein the first front set circuit comprises a first clock generator and a first logic gate, the first middle set circuit comprises a second clock generator, $k_1$ serially connected first sets of clock generators in which $k_1 \geq 0$, and $n-k_1-1$ serially connected second sets of clock generators in which $n-k_1-1 \geq 0$, the $k_1$ serially connected first sets of clock generators being initially set to different values than the $n-k_1-1$ serially connected second sets of clock generators, and the first rear set circuit comprises a third clock generator and a second logic gate;
 a second dividing circuit receiving the second clock and generating a second target clock in cooperation with a second front set circuit, a second middle set circuit and a second rear set circuit connected serially in sequence inside, wherein the second front set circuit comprises a fourth clock generator and a third logic gate, the second middle set circuit comprises a fifth clock generator, $k_2$ serially connected third sets of clock generators in which $k_2 \geq 0$, and $n-k_2-1$ serially connected fourth sets of clock generators in which $n-k_2-1 \geq 0$, the $k_2$ serially connected third sets of clock generators being initially set to different values than the $n-k_2-1$ serially connected fourth sets of clock generators, and the second rear set circuit comprises a sixth clock generator and a fourth logic gate; and
 a synthesizing circuit outputting the target clock according to the first target clock and the second target clock.

8. The non-integer frequency divider of claim 7, wherein the first clock generator, the second clock generator, the $k_1$ serially connected first sets of clock generators, and the $n-k_1-1$ serially connected second sets of clock generators are rising-edge-triggered clock generators, and the third clock generator is a falling-edge-triggered clock generator.

9. The non-integer frequency divider of claim 7, wherein the first clock generator, the second clock generator, the $k_1$ serially connected first sets of clock generators, and the $n-k_1-1$ serially connected second sets of clock generators are falling-edge-triggered clock generators, and the third clock generator is a rising-edge-triggered clock generator.

10. The non-integer frequency divider of claim 7, wherein the fourth clock generator, the fifth clock generator, the $k_2$ serially connected third sets of clock generators, and the $n-k_2-1$ serially connected fourth sets of clock generators are rising-edge-triggered clock generators, and the sixth clock generator is a falling-edge-triggered clock generator.

11. The non-integer frequency divider of claim 7, wherein the fourth clock generator, the fifth clock generator, the $k_2$ serially connected third sets of clock generators, and the $n-k_2-1$ serially connected fourth sets of clock generators are falling-edge-triggered clock generators, and the sixth clock generator is a rising-edge-triggered clock generator.

12. The non-integer frequency divider of claim 7, wherein a clock input end of the second clock generator in the first middle set circuit is connected to the first clock, a clock input end of each of the $k_1$ serially connected first sets of clock generators is connected to the first clock, an output end of the last clock generator in the $k_1$ first sets of clock generators is connected to a signal input end of the second clock generator, a clock input end of each of the $n-k_1-1$ serially connected second sets of clock generators is connected to the first clock, a signal input end of the first clock generator of the second sets of clock generators is connected to an output end of the first logic gate, and an output end of the last clock generator of the second sets of clock generators is connected to a signal input end of the first clock generator of the $k_1$ first sets of clock generators.

13. The non-integer frequency divider of claim 12, wherein the second clock generator and the $k_1$ serially connected first sets of clock generators are initially-set-low clock generators, and the $n-k_1-1$ serially connected second sets of clock generators are initially-set-high clock generators.

14. The non-integer frequency divider of claim 7, wherein a clock input end of the fifth clock generator in the second middle set circuit is connected to the second clock, a clock input end of each of the $k_2$ serially connected third sets of clock generators is connected to the second clock, an output end of the last clock generator in the $k_2$ third sets of clock generators is connected to a signal input end of the fifth clock generator, a clock input end of each of the $n-k_2-1$ serially connected fourth sets of clock generators is connected to the second clock, a signal input end of the first clock generator of the fourth sets of clock generators is connected to an output end of the third logic gate, and an output end of the last clock generator of the fourth sets of clock generators is connected to a signal input end of the first clock generator of the $k_2$ third sets of clock generators.

15. The non-integer frequency divider of claim 14, wherein the fifth clock generator and the $k_2$ serially connected third sets of clock generators are initially-set-low clock generators, and the $n-k_2-1$ serially connected fourth sets of clock generators are initially-set-high clock generators.

16. The non-integer frequency divider of claim 7, wherein the synthesizing circuit comprises an XOR gate.

17. The non-integer frequency divider of claim 7, wherein a clock input end of the first clock generator in the first front set circuit is connected to the first clock, the first logic gate is a NOR gate with a first input end connected to an output end of the first clock generator and a second input end connected to a signal input end of the first clock generator, a clock input end of the third clock generator in the first rear set circuit is connected to the first clock, a signal input end of the third clock generator in the first rear set circuit is connected to an output end of the second clock generator in the first middle set circuit, the second logic gate is an OR gate with a first input end connected to an output end of the third clock generator and a second input end connected to an output end of the second clock generator in the first middle set circuit, and the output end generates the first target clock.

18. The non-integer frequency divider of claim 7, wherein a clock input end of the fourth clock generator in the second front set circuit is connected to the second clock, the third logic gate is a NOR gate with a first input end connected to an output end of the fourth clock generator and a second input end connected to a signal input end of the fourth clock generator, a clock input end of the sixth clock generator in the second rear set circuit is connected to the second clock, a signal input end of the sixth clock generator in the second rear set circuit is connected to an output end of the fifth clock generator in the second middle set circuit, the fourth logic gate is an OR gate with a first input end connected to an output end of the sixth clock generator and a second input end connected to an output end of the fifth clock generator in the second middle set circuit, and the output end generates the second target clock.

19. A frequency divider dividing an original clock into a target clock, the frequency of the target clock being equal to the frequency of the original clock divided by M, M being a positive odd integer equal to or greater than 3, the frequency divider comprising:
 a front set circuit comprising:
  a first clock generator with a clock input end connected to a trigger clock having a frequency the same as that of the original clock and a trigger phase; and
  a first logic gate with a first input end connected to an output end of the first clock generator, and a second input end connected to a signal input end of the first clock generator;
 a middle set circuit comprising:
  a second clock generator with a clock input end connected to the trigger clock, and a signal input end connected to an output end of the first logic gate in the front set circuit; and
 a rear set circuit comprising:
  a third clock generator with a clock input end connected to the trigger clock, and a signal input end connected to an output end of the second clock generator in the middle set circuit; and
  a second logic gate with a first input end connected to an output end of the third clock generator in the rear set circuit, a second input end connected to the output end of the second clock generator in the middle set circuit, and an output end for outputting the target clock.

20. The frequency divider of claim 19, wherein the first clock generator in the front set circuit and the second clock generator in the middle set circuit are rising-edge-triggered clock generators, and the third clock generator in the rear set of circuit is a falling-edge-triggered clock generator.

21. The frequency divider of claim 19, wherein the first clock generator in the front set circuit and the second clock generator in the middle set circuit are falling-edge-triggered clock generators, and the third clock generator in the rear set of circuit is a rising-edge-triggered clock generator.

22. The frequency divider of claim 19, wherein the trigger phase is 0 degrees, and the trigger clock is identical to the original clock.

23. The frequency divider of claim 22, wherein the first clock generator in the front set circuit, the second clock generator in the middle set circuit, and the third clock generator in the rear set of circuit are initially-set-low clock generators.

24. The frequency divider of claim 19, wherein the first logic gate is a NOR gate, and the second logic gate is an OR gate.

25. A method for designing a frequency divider to divide an original clock to form a target clock, the method comprising:
 phase shifting the original clock to generate a first clock and a second clock according to the original clock, the first clock and the second clock being out of phase with each other and each having the same frequency as the original clock;

dividing the frequency of each of the first clock and the second clock by a factor of M to respectively generate first and second divided clocks, M being a positive odd integer equal to or greater than 3; and performing an XOR logic operation on the first and second divided clocks to generate the target clock with a frequency that is twice the frequency of the first and second divided clocks.

26. The method of claim 25, wherein the first and second clocks are 90 degrees out of phase with each other.

27. The method of claim 26, wherein the first and second divided clocks each have a duty cycle of 50%.

* * * * *